United States Patent

[11] 3,611,061

[72] Inventor Eugene E. Segerson
Tempe, Ariz.
[21] Appl. No. 156,347
[22] Filed July 7, 1971
[45] Patented Oct. 5, 1971
[73] Assignee Motorola, Inc.
Franklin Park, Ill.
Continuation of application Ser. No. 534,752, Mar. 16, 1966.

[54] MULTIPLE LEAD INTEGRATED CIRCUIT DEVICE AND FRAME MEMBER FOR THE FABRICATION THEREOF
21 Claims, 11 Drawing Figs.

[52] U.S. Cl. .......... 317/234 R, 317/235 R, 317/234 N, 174/52 PE, 174/52 R, 29/193.5, 29/589
[51] Int. Cl. .......... H01l 5/00
[50] Field of Search .......... 317/234 (5.4), 234 (22); 174/52 S, 52 PE, 68.5; 29/193, 193.5

[56] References Cited

UNITED STATES PATENTS

| | | | |
|---|---|---|---|
| 3,171,187 | 3/1965 | Ikeda et al. | 29/25.3 |
| 3,262,022 | 7/1966 | Caracciolo | 317/101 |
| 3,265,806 | 8/1966 | Burks et al. | 174/52 |
| 3,281,628 | 10/1966 | Bauer et al. | 317/234 |
| 3,317,287 | 5/1967 | Caracciolo | 29/193 |
| 3,341,649 | 9/1967 | James | 174/52 |
| 3,423,516 | 1/1969 | Segerson | 174/52 |
| 3,431,092 | 3/1969 | Lehner | 29/193.5 |
| 3,436,810 | 4/1969 | Kauffman | 29/577 |
| 3,444,440 | 5/1969 | Bell et al. | 317/234 |
| 3,444,441 | 5/1969 | Helda et al. | 317/234 |
| 3,544,857 | 12/1970 | Byrne et al. | 317/234 |

FOREIGN PATENTS

| | | | |
|---|---|---|---|
| 1,048,624 | 1/1959 | Germany | 317/235 X |

OTHER REFERENCES

G.E. Semiconductor Products Department Supplement To " Active Discrete Pellet Functional Device" Brochure 11/63

*Primary Examiner*—John W. Huckert
*Assistant Examiner*—B. Estrin
*Attorney*—Mueller and Aichele

ABSTRACT: A semiconductor device, and more specifically an integrated circuit device, is fabricated by mounting on a one-piece metallic frame member one or more integrated circuit structures or semiconductor units. The frame member is provided with a plurality of groups of metallic parts, and each group comprises a mounting portion or portions for corresponding integrated circuit structure and frame means for the group. Each such group in the frame member also comprises in its metallic parts, metal means or lead portions which are electrically connected with contacts on the integrated circuit structure. To help to stabilize the position of the lead portions in a group while the ultimate device is being fabricated and to serve as a plastic-flash-limiter when the active parts of the semiconductor devices are being plastic-encapsulated in a mold cavity under pressure molding, integral metallic lead spacers extend between adjacent lead portions. The frame means and lead spacers are severed during the complete fabricating cycle.

INVENTOR.
Eugene E. Segerson

BY

Mueller, Aichele & Rauner

ATTYS.

INVENTOR.
Eugene E. Segerson

BY

Mueller, Aichele & Rauner

ATTY'S.

MULTIPLE LEAD INTEGRATED CIRCUIT DEVICE AND FRAME MEMBER FOR THE FABRICATION THEREOF

RELATED INVENTIONS

This is a continuation of application Ser. No. 534,752 which was filed Mar. 16, 1966, and the invention of this application is an improvement over the related inventions owned by the assignee of this application and covered in U.S. Pat. Nos. 3,367,025 issued Feb. 6, 1968; 3,444,440 issued May 13, 1969; 3,531,856 issued Oct. 6, 1970; 3,413,713 issued Dec. 3, 1968; 3,444,441 issued May 13, 1969; 3,431,092 issued Mar. 4, 1969; 3,391,426 issued July 9, 1968; 3,539,675 issued Nov. 10, 1970; as well as 3,423,516 issued Jan. 21, 1969 on another metallic frame member and semiconductor device invention of applicant.

This invention relates to semiconductor devices, and more particularly to such devices as integrated circuits or multiple circuits on a single substrate with a corresponding large number of circuit connections and corresponding leads out of the device, wherein the principal element is a metal member which is originally provided in an elongated stamped metal strip made up of a plurality of segments to be fabricated and then separated for ultimate semiconductor devices. Each of the segments has a predetermined pattern formed or cut out according to the multiple-contact and the connecting-lead requirements of the device. The metal member and originally joined segments serve as the vehicle for automated manufacture, plastic encapsulation, and ultimate easy and low cost assembly into equipment.

A semiconductor device requires a "package" in the sense of a structural covering that is strong enough to withstand the mechanical stresses incurred during the manufacture of the device, subsequent connection with other devices, and then incurred during the use thereof. Industry has come to require that any "package" for semiconductor devices including integrated circuits be small, and of a shape which permits efficient utilization of available limited space. Another function of the package is to maintain the semiconductor unit of the device in a controlled environment so as to prevent detrimental variations in the operating characteristics of the device. Cost of installation is also a factor in the commercial acceptance of such devices. To meet these standards for multiple lead units such as integrated circuits, the "packages" have been comprised of many individual parts carefully assembled and joined together, and the semiconductor unit has been taken in assembled condition and housed in a separate can or the like. This type of complete "package" is costly to assemble and encapsulate, and subject to many defects because of the numerous individual parts.

Although plastic is known to possess many of the required features of a good packaging medium its use has generally been limited to devices such as diodes and transistors, having two, three, or four leads. The assignee of this present invention has demonstrated great utility in the structure and method of assembly which it employs for such few lead devices in plastic encapsulation, which are manufactured almost entirely in automated steps.

For multiple lead devices, such as integrated circuits requiring ten leads, up to 64 and even more leads, new and difficult electrical and mechanical problems arose. These stem from the much greater overall area required to accommodate the complex integrated circuit element itself, and associated portions. This element necessitates more leads to the corresponding circuits in the equipment in which it is to be installed. Electrical characteristics and equipment space limitations require a high density for the ultimate complete device and package. These mechanical and electrical requirements for the device complicated the assembly and the ultimate plastic encapsulation by automated fabrication which is essential from a cost standpoint in this highly competitive industry.

A feature of the present invention which solves these problems is a plastic encapsulated semiconductor device fabricated primarily on a metal frame that accommodates ten or more wire connections to corresponding contact portions on a semiconductor integrated circuit unit wherein the unit is centrally mounted relative to leads spaced around it and permits each wire to be of relatively short length, and that length being such that there are no undesirable electrical consequences from the same.

Another feature of the invention is the provision of such a plastic encapsulated semiconductor device having a lead arrangement for connecting the device into electrical equipment either in a plug-in or in a soldered type of mounting connection which will lend itself to a wide range such as ten to one hundred leads and a corresponding number of wire connections from the lead ends within a plastic housing to a semiconductor structure mounted on a portion centrally positioned relative to the lead ends which are located in rows adjacent to such portion so that the wire connections are all of a relatively short and proportionately equal length.

A still further feature is the provision of a device with the features described in the preceding two paragraphs, and size and outer configuration flexibility, which will still readily lend itself to automated assembly or fabrication in an elongated strip form for plastic encapsulation in individual segmental units on the strip form, and then ready separation into individual completed integrated circuit devices.

Figure 3A:
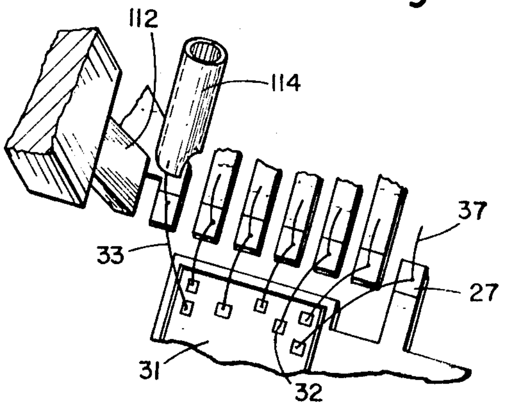
Figure 4:
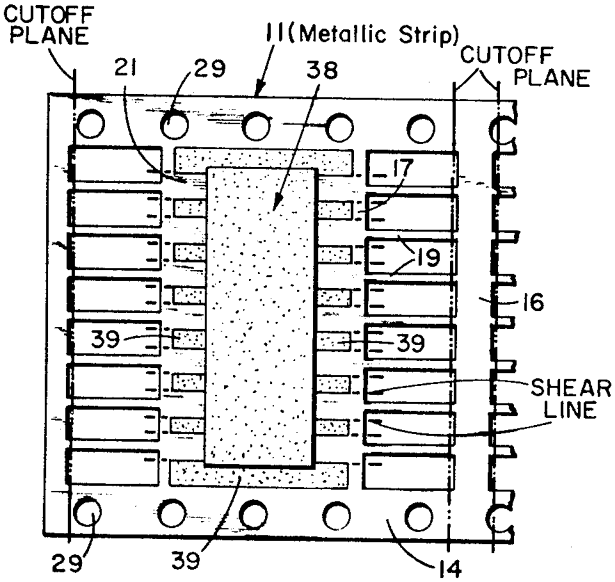
Figure 3B:
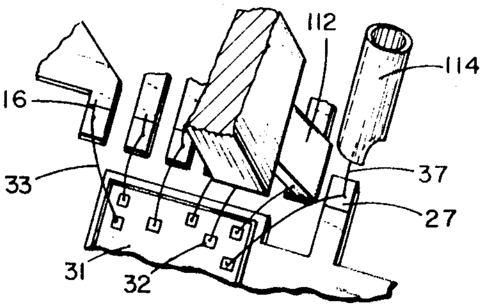
Figure 5A:
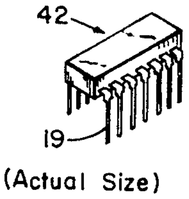
Figure 5B:
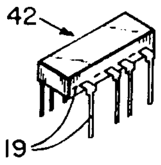
Figures 6, 7:
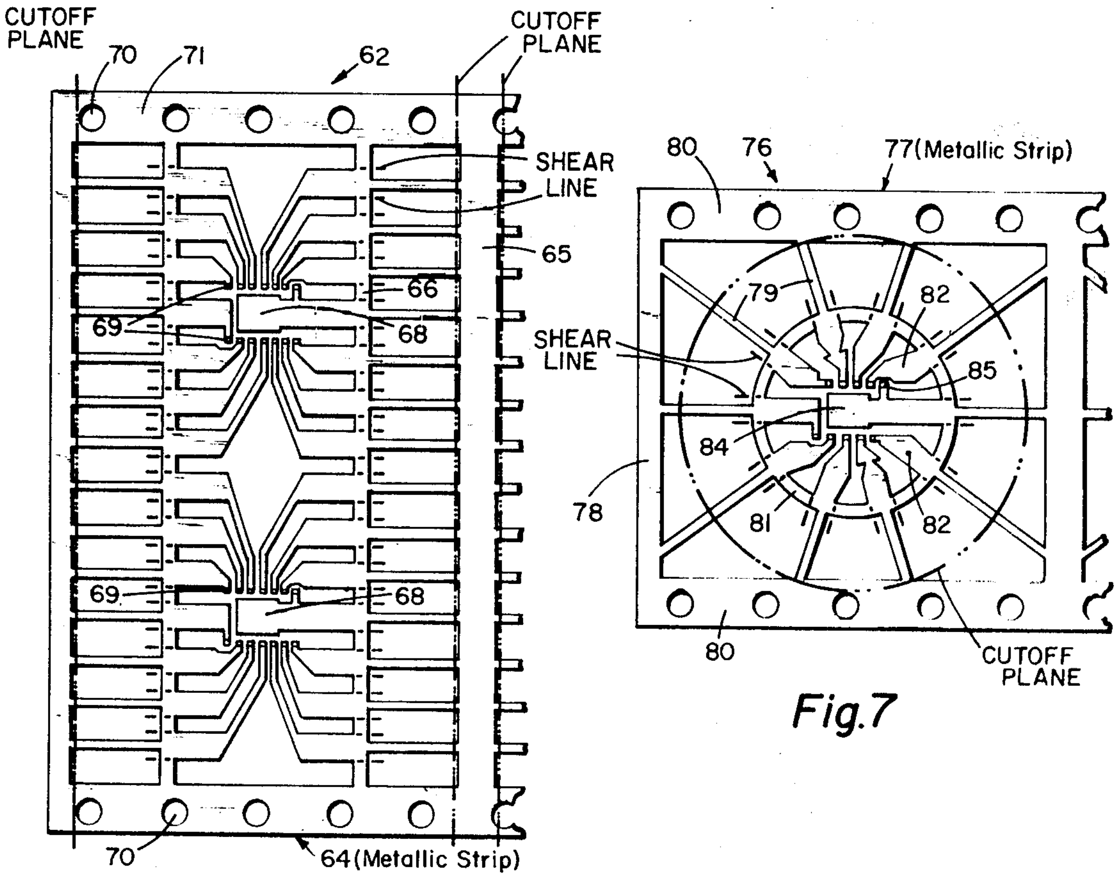
Figure 8:
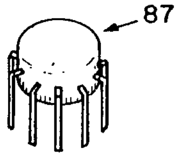
Figure 9:
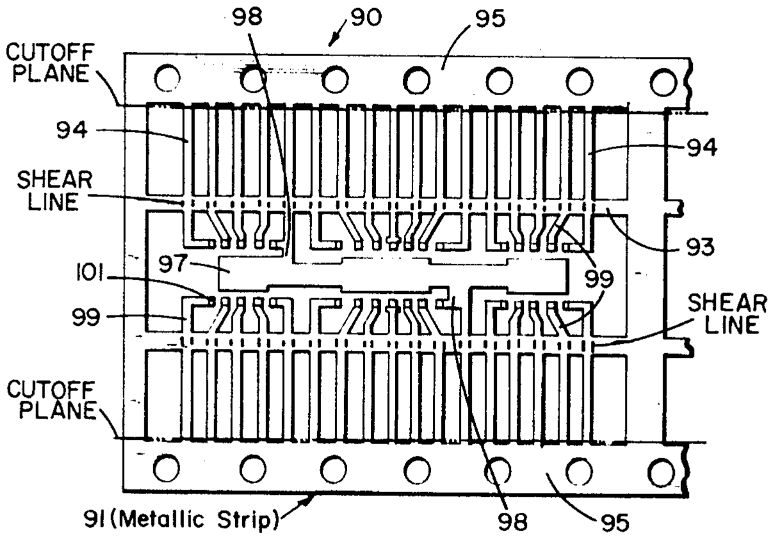

FIG. **3*a*** is an enlarged perspective view of a fragment of the mounting portion with an electronic unit thereon electrically connected by fine wires to adjacent wire bonding areas and a cutter in position to trim the tails of these fine wires;

FIG. **3*b* is a view corresponding to FIG. 3*a*** after the removal of the excess portion of certain of the wire tails;

FIG. 4 is an enlarged view of a semiconductor device after encapsulation, showing by dotted lines the portion of the metallic strip removed in the final steps of the device fabrication;

FIG. **5*a*** is a perspective view showing the actual size of one form of a completely assembled semiconductor device of the invention ready for use;

FIG. **5*b*** is a perspective view showing the actual size of a semiconductor device fabricated according to the invention with selected external leads removed;

FIG. 6 is an enlarged plan view of one segment of a stamped metallic strip including a plurality of such segments for another embodiment of the invention having a substantially increased number of external leads;

FIG. 7 is a plan view of a segment of a metallic strip including a plurality of similar segments for yet another embodiment of this invention providing a circular lead configuration;

FIG. 8 is a perspective view showing the actual size of the completed semiconductor device assembled on the segment shown in FIG. 7; and FIG. 9 is an enlarged plan view of a segment for another embodiment of the invention which is one of a plurality of similar segments formed in an elongated strip offering an increased number of external leads for an electronic unit assembled thereon.

This invention is embodied in a semiconductor device including formed metallic parts originally joined together and adapted to be assembled and encapsulated primarily by automated equipment. The device is comprised of a plurality of metallic supporting sections which have extensions projecting inwardly at an angle toward a central location. The extensions terminate in end portions arranged in two parallel rows, each on opposite sides of the central location. A mounting portion is positioned in the central location adjacent to and intermediate the parallel rows of end portions. At least one of the supporting sections is integral with this mounting portion. An electronic unit requiring multiple leads, generally an integrated circuit, is secured to the mounting portion and joined by an electrical connecting means to the end portions. Leads extend outwardly from the corresponding supporting sections. A covering is disposed over the mounting portion, electronic unit thereon, the connecting means, the end portions, the extensions and a portion of the supporting sections. The complete device structure lends itself to automated fabrication with the final metallic frame being merely a portion of what is originally a continuous elongated strip which can be fed through a machine for automated assembly, or can be handled partly by machine and partly by hand operations. The lead portions extending out of the encapsulation can be bent for a plug-in type assembly in equipment, or a soldered connection.

The fabrication comprises assembling an integrated circuit on a mounting portion of the frame, and connecting the many contacts on that integrated circuit by very fine wires to lead portions in the frame which will ultimately connect the finished device into equipment. The mounting portion is centrally placed within the frame with the lead portions spaced from the mounting portion but arranged on each side thereof and generally around the mounting portion so that the adjacent ends to which fine wires are attached are positioned in a straight line in separate groups on opposite sides of the mounting portion in the frame. With this arrangement, the fine wire connections between the active electronic component contacts and the ends of the lead portions can first be made most quickly and effectively by machine, and the wires then correspondingly trimmed to final form by machine. Because of the savings in costs of piece parts and device assembly operations resulting from the use of this metallic frame, the final semiconductor devices fabricated according to the invention have a cost that may be between about 80 percent and 90 percent less than prior art devices.

The small size of the ultimate device is important to consider in understanding the ultimate practice of this invention. The outside dimension of the metallic frame portion of a single device when it is still integrated with the one-piece elongated metal strip is only 1 inch by 1 inch for one specific fourteen-contact embodiment. When each device portion is complete with wire and semiconductor structure, then it is encapsulated with plastic in a molding operation, and thereafter separated by cutting that portion from the elongated metallic strip, ready for the leads to be bent to a configuration for the ultimate assembly into electronic equipment.

The invention could be embodied in a four-contact integrated circuit device or electronic component assembly, but it is adapted primarily for such a device with ten contacts and up to as many as 64, or even 100 contacts. With the arrangement of the active element mounting portion and adjacent lead portion ends for fine wire connections, the outside configuration represented in the final encapsulation and protruding lead ends may be square, rectangular, or round, to meet the equipment requirements in which the device will be assembled.

Figure 1:
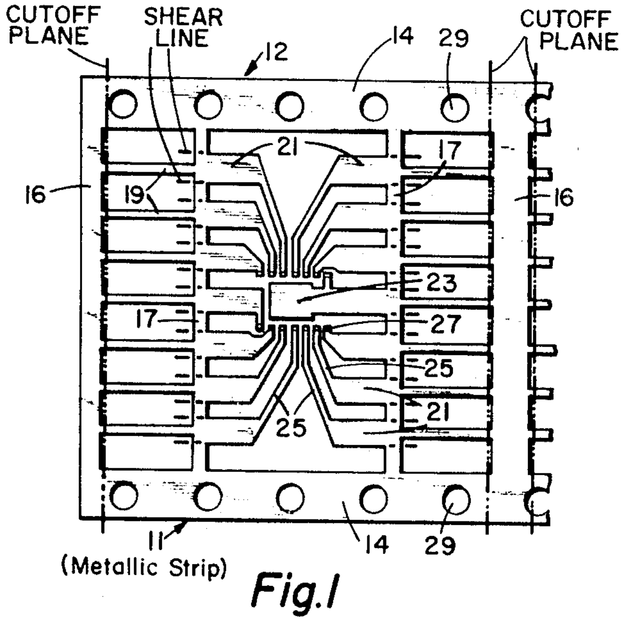
FIG. 1 is an enlarged plan view of a frame member representing one segment of an elongated stamped metallic strip including a plurality of corresponding segments.

Referring now to FIG. 1, segment 12 is illustrated as broken out of an elongated metallic strip 11. The segment illustrated is taken from one end of the elongated strip. Metallic strip 11 is fabricated from a strip of nickel of a desired gauge and width by a series of metal stamping steps. A good electrical and heat conducting metal that is relatively soft and corrosion resistant is preferred for metallic strip 11. Chemical etching, and mechanical machining are also suitable for fabricating this metallic member.

Two parallel joining bands 14 extend the length of the entire metallic strip 11 and define the longitudinal extremity of the semiconductor devices to be assembled. A plurality of parallel lead connecting portions 16 integral with joining bands 14 and perpendicular thereto are even spaced along the length of metallic member 11. These lead connecting portions are wide in cross section and reinforce metallic strip 11 to facilitate the handling of the many partially and completely assembled semiconductor devices which are being fabricated in the long strip at one time, and are not separated until after encapsulation. Adjacent lead connecting portions 16 also define the lateral extremity of the leads of the semiconductor devices shown in their completed form in FIGS. *5a* and *5b*.

A pair of lead spacers 17 are fabricated intermediate and parallel to adjacent lead connecting portions 16. Lead spacers 17 are also integral with joining bands 14. Although of a substantially smaller cross section than a lead connecting portion 16, lead spacers 17 give additional reinforcement to metallic strip 11 in its elongated strip form. Extending outwardly from each lead spacer 17 to the adjacent lead connecting portion 16 are a plurality of parallel leads 19. The number of leads fabricated is determined by the semiconductor device being assembled. For the semiconductor device illustrated in FIGS. 1 to 5 herein, 14 leads are required, with seven on the right side and seven on the left side providing a symmetrical configuration. Leads 19 are coined to remove the sharp edges formed in the stamping process and facilitate the insertion of the semiconductor device in electrical receptacles. Extending inwardly from adjacent lead spacers 17 are supporting sections 21 positioned opposite leads 19. At least one of the supporting sections 21 terminate in a mounting portion 23 centrally located in segment 12. The remaining supporting sections 21 have extensions 25 projecting inwardly toward mounting portion 23 at varying angles such that they terminate in end portions or wire bonding areas 27 arranged in two parallel rows adjacent thereto. Supporting sections 21 have a substantially larger cross section than adjacent parts so that they may readily support and maintain the proper positions of the mounting area 23 and extensions 25.

An indexing array, in the form of openings 29, is provided in the original strip of metal, and is then available for indexing the strip. These facilitate the stamping of metallic strip 11 and remain in the joining bands 14 for use in the assembling steps for the semiconductor devices.

Figure 2:
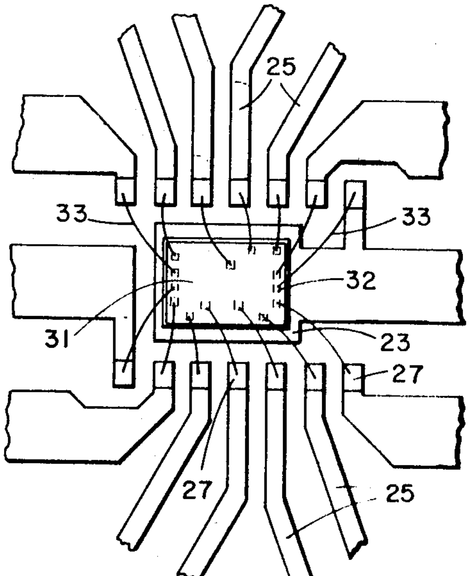
FIG. 2 is a fragmentary plan view of a die mounting portion of the segment of FIG. 1, but enlarged over that of FIG. 1, with an electronic unit mounted thereon and electrically connected to wire bonding areas adjacent to the mounting portion.

In FIG. 2, an electronic unit 31 is shown mounted on mounting portion 23. Unit 31 is illustrated as a monolithic integrated circuit fabricated from a monocrystalline silicon substrate. To mount unit 31 and fabricate the complete device, metallic strip 11 is placed on a conveyor with projections that cooperate with indexing array 29. The conveyor is programmed to position the mounting portion 23 at a predetermined location in a die bonder. Unit 31 is carefully oriented so that the die bonder may grasp it and automatically attach it to mounting portion 23. The metallic segment 12 is most beneficially used with multiple lead devices. However, this is not limited to a monolithic integrated circuit unit, and may be used equally well with a combination of semiconductor elements such as discrete transistors, diodes and other circuit elements combined on the mounting portion 23 to form an operating circuit, or any collection of minute elements assembled on a suitable substrate and mounted thereon.

Indexing array 29 is also utilized to position metallic member 11 in a wire bonder. Fine gold wires 33 0.001 inch in diameter, in one embodiment, are connected to wire bonding pads or electrodes 32 on the unit 31. These wires 33 are then bonded to wire bonding areas 27 thereby electrically connecting unit 31 to external leads 19. The fine wires 33 can be joined to bonding pads 32 and wire bonding areas 27 by thermocompression welding. By positioning each unit 31 and corresponding area 27 very carefully in the wire bonder and maintaining a constant positional relationship between the two, the time required for wire bonding is substantially reduced. The positional relationship of these two is important factor in achieving a sound, strong thermocompression weld. Even when connecting to the outermost wire bonding area, the wire 33 leaves wire bonding pad 32 at an angle that is insufficient to materially weaken the weld. The welding is greatly simplified by reducing it to a two directional operation on dependably located predetermined wire bonding areas.

To enhance the mounting of the semiconductor unit and for wire bonding, metallic strip 11, fabricated from nickel in this instance, is plated with gold after the stamping operation. Further with respect to bonding the fine wires 33, a small hook or other stop is generally formed in the wire to retain it at the tip of the wire bonder. Wire 33 is preferably bonded first to a bonding pad 32 on unit 31 and then to the selected corresponding one wire bonding area 27, forming an arc therebetween. After the electrical connection is complete, the wire bonder is raised vertically relative to the wire bonding area to a sufficient height that wire cutters may sever wire 33 without injuring the connecting arc. This results in a long tail 37 (FIG. *3a*) of wire projecting upwardly from each wire bonding area 27. These tails are objectionable because they may cause shorts by contacting each other, contacting portions of the unit or components or projecting from the enclosing package. Because wire bonding areas 27 are in a straight row, the tails 37 are also in a substantially straight row. The alignment of tails 37 in a straight row expedites the automated removal of the excess portion thereof. The partially assembled devices pass by "tail cutters" each consisting of a graphite resistance point 112 carefully positioned to contact tails 37 at a predetermined height. An electrical circuit is established such that an electrical pulse occurs when contact is made between tails 37 and graphite point 112 that causes the tails to melt. The resultant loose pieces of wire are removed by a vacuum line 114 leaving a tail 116 (FIG. *3b*) of the proper length. Although the space between the arc of wire 33 and tails 37 is very small, the precise positioning of graphite point 112 permits the automated removal of the excess tail portions of units assembled on strip 11 without damaging the remainder of the wire or the portions to which each wire is connected.

Metallic strip 11, with a plurality of segments 12 partially assembled as described, is positioned in a transfer mold (not shown) in preparation for encapsulation in plastic. Indexing array 29 cooperating with a corresponding array on the mold face aligns strip 11 precisely in the mold. The upper and lower mold faces close on joining bands 14 and lead spacers 17 with sufficient force to deform them and seal the mold with metal to metal contact. To form an effective encapsulation, an epoxy plastic is forced into the mold cavities containing the semiconductor unit and related parts at a low viscosity and high pressure. Of the many well-known plastic materials, a thermosetting epoxy or silicone base compound is preferred for the encapsulation. The pressure is maintained in the mold cavities until the curing cycle of the plastic is complete, which is about 30 seconds in one such process step. A plastic package 38 (FIG. 4) thereby fabricated is dense, rugged and effectively sealed to protect the semiconductor unit 31 from contamination. Plastic package 38 also reduces the possibility of breakage or shorting with one another of wires 33 during use of the device by holding them stationary. This beneficial effect of the plastic encapsulation permits the use of longer wire segments as the connecting wires 33, thereby allowing greater spacing between bonding pads 32 and wire bonding areas 27.

During the molding cycle, a thin plastic flash 39 forms in the openings between supporting section 21, joining band 14 and lead spacer 17. This flash is easily removed with joining band 14 when lead spacer 17 is removed by shearing along the shear line, shown in FIG. 4, and lead connecting portion 16 is removed by shearing along the cutoff plane also shown in FIG. 4. For this shearing operation, metallic member 11 is correctly positioned by indexing array 29 cooperating with a corresponding array in the shear.

The actual size and completed configuration of the plastic encapsulated semiconductor device 42 is shown in FIG. *5a*. The separated external leads 19 are bent down at 90° from their original plane to aid the insertion of the semiconductor device in a receptacle. It is not always necessary that these leads be bent at 90°. In fact, it is often desirable that they be left in their original plane or deflected slightly to be coplanar with bottom of package, so that they may be welded or soldered flat to a printed circuit board. Selected ones of leads 19 that are not active are, as an alternate structure, severed (FIG. *5b*) to reduce the number of leads that must be inserted in the receptacle. This reduces the time required to insert semiconductor device 42 in the receptacle and reduces the possibility of inserting leads in incorrect sockets. Also, the unit of FIG. *5b* may be used with a receptacle that does not contain the full 14 sockets for semiconductor device 42 in its complete form of FIG. *5a*.

Semiconductor device 42 in the embodiment which has been described herein comprises a plastic encapsulation about 0.725 inch long, 0.25 inch wide and 0.145 inch high. Leads 19 are about 0.010 inch thick, 0.16 inch wide and coined with a 0.005 inch radius to facilitate insertion of the device in electrical receptacles. Metallic member 11, upon which the device is assembled, is fabricated from nickel 0.010 inch thick ±0.003 inch. Supporting sections 21 are 0.050 inch wide whereas leads 19 are only 0.016 inch wide and extensions 25 0.014 inch wide, all with tolerances of ± 0.001 inch. These typical dimensions indicate the exactness that is desired in fabricating metallic member 11.

In another embodiment of this invention, a segment 62 (FIG. 6), formed in an elongated metallic strip 64, is shown with two joined portions each of which is similar to that shown in FIG. 1. Segment 62 is utilized for fabricating a semiconductor device containing two related integrated circuits within a single plastic encapsulation. Lead connecting portion 65 and lead spacer 66, although approximately twice as long as the corresponding portions 16 and 17 of FIG. 1, provide sufficient rigidity that metallic strip 64 may still be easily handled in strip form as previously described with a plurality of partially assembled units thereon. The mounting portion 68 and wire bonding areas 69 are maintained in the same basic relationship as for segment 12 (FIG. 1). By maintaining this configuration, this embodiment of the invention may be utilized for fabrication of a twenty-eight (28) lead device on automated equipment corresponding generally to that for the fabrication of a fourteen (14) lead device with metallic strip 14. Indexing array 70 in a joining band 71 is used to maintain the proper alignment and position of metallic strip 64 during the various fabricating steps. As mentioned above, the steps of fabrication with segment 62 are basically the same as those for segment 12. The plastic encapsulation formed for this semiconductor device will cover the active elements on the mounting portions 68 and the wires on wire bonding areas 69 as for FIGS. 1 to 5. The final lead configuration of the device will be determined after plastic encapsulation when the unit is positioned in a shear with indexing array 70 and sheared along the cut off plane and the shear line. This device will have the same appearance as that shown in FIG. *5a* with allowance for the additional length.

Because many circuits utilizing semiconductor devices have been designed for a package which has a round lead configuration, it is also desirable to have a package that provides a corresponding round lead configuration in a plastic encapsulated multicontact unit. Another embodiment of this invention is illustrated in segment 76 (FIG. 7), which is one of a plurality of such segments formed in a metallic strip 77 that provides a suitable round lead configuration for that purpose. Leads 79 extend radially from a center point to parallel joining bands 80 and parallel connecting portions 78 which are perpendicular to each other. Lead spacer 81 joins leads 79 in the manner of the lead spacers 17 and 66 and maintains their position relative to each other. Enlarged extensions 82 opposite leads 79 project inwardly from lead spacer 81. One of extensions 82 terminates in a unit or component mounting portion 84 which is centrally located in segment 76. Extensions 82 also terminate in wire bonding areas 85 adjacent to and spaced from the mounting portion 84. Wire bonding areas 85 form two parallel rows adjacent to mounting portion 84. The relative positions of mounting portion 84 and wire bonding areas 85 are maintained substantially the same as those of segment 12 (FIG. 1) so that the fabrication of the semiconductor device may be performed on the same automated equipment. Wire bonding areas 85 are in a straight row to facilitate the wire bonding operation and the removal of the wire tails as described previously. The sealing of the transfer mold which is used to form the plastic encapsulation is readily accomplished by the mold closing on and deforming lead spacer 81. In this manner the advantageous metal to metal seal of the mold is readily accomplished.

After encapsulation in plastic, the lead configuration of the device is determined by shearing along the cut off plane and shear line. The leads are bent at 90° to form a round lead array suitable for insertion in a corresponding receptacle.

In another embodiment of the invention (FIG. 9) a segment 90, which is one of a plurality of segments formed on an elongated metal strip or member 91, with 34 external leads is shown. For this 34 lead segments, lead spacers 93 and leads 94 have been rotated 90° from those of segment 12 (FIG. 1). With this rotation, the distance between joining bands 95 is maintained the same as for segment 12 in FIG. 1. A centrally located mounting portion 97 is extended substantially over the whole length of segment 91 thereby providing an electrically common mounting area for a plurality of semiconductor units. Because of the increased size of mounting portion 97, it is joined at two extensions 98 on opposite sides but differently positioned to provide additional support. A plurality of electrically separate mounting areas may be fabricated by severing mounting portion 97 into the desired number of individual areas supported then by one extension 98 each as can be understood from the drawing. Segment 90 may be expanded to accommodate not only a monolithic integrated circuit, but also a plurality of chips and accessory components such as capacitors, diodes, etc., by placing a piece of insulating ceramic or plastic laminate material on mounting portion 97. A plurality of wire bonding areas 101 at the ends of supporting sections 99 are in two parallel rows adjacent to and spaced from mounting portion 97 to facilitate wire bonding and the removal of the fine wire tails, as previously described. Segment 90, although substantially longer than segment 12 (FIG. 1), is fabricated so that a semiconductor unit may be assembled with this frame utilizing the same automated equipment as that described for the first embodiment of the invention. After plastic encapsulation, this segment is sheared along the cut off plane and the shear line to form the final lead configuration of the device.

Thus, the present invention provides a novel semiconductor device such as an integrated circuit with external leads which can vary in number over a very wide range while lending itself to ready automated assembly and plastic encapsulation whether ten lead connections are required or even one hundred, and still retaining predetermined acceptable electrical characteristics.

I claim:

1. An elongated metallic frame member for use in the high speed fabrication of a plurality of individual integrated circuit devices each of which has fine wire connections from a semiconductor means for the device, each of which is headerless, and each of which is encased in a plastic housing that is molded under pressure around portions of the device while such portions of such device are still a part of the metallic frame member, with the plastic housing both sealing around and mechanically supporting said portions of the device, said metallic frame member including a plurality of individual metal means arranged in predetermined groups with each group adapted to be fabricated into an integrated circuit device, frame means surrounding a predetermined group of individual metal means in said elongated frame member, at least one of said individual metal means in each predetermined group having a mounting area thereon positioned generally centrally within the frame means for said group for receiving semiconductor means thereon, with individual metal means in a predetermined group being spaced apart from one another and rigidly maintained in spaced apart position in said frame member by spacer bar portions, with such individual metal means of a predetermined group each having an end portion which extends toward said mounting area and each having a free end portion on said end portion, and each such individual metal means adapted during fabrication of integrated circuit devices to be electrically connected at a free end portion with semiconductor means on said mounting area by a fine wire, with the integrated circuit devices to be fabricated from said metallic frame member adapted to be encased by plastic pressure molding in a single housing which encases and seals said mounting area and said semiconductor means and said fine wires and said end portions of the individual metal means of each said group, with said spacer bar portions in said frame member for each predetermined group spaced outwardly within a frame means away from the mounting area in the group and from the free end portions, and in addition to said position-maintaining-function of said spacer bar portions for said individual metal means, said spacer bar portions also being adapted to lay with respect to a mold and mold cavity and to cooperate with frame means for the predetermined group such as to limit the spread of plastic flash outside of the mold cavity for each predetermined group during a plastic encasing pressure molding operation for each one of the plurality of integrated circuit devices, and each such device after the molding operation being severable as a complete plastic encased integrated circuit device from said spacer bar portions and from frame means for a predetermined group in the frame member.

2. In an elongated metallic frame member as defined in claim 1 wherein the spacer bar portions for a predetermined group of metal means extend in two lines spaced from one another in such group and longitudinally of the elongated metallic frame member.

3. In an elongated metallic frame member as defined in claim 1 wherein the spacer bar portions for a predetermined group of metal means extend in two lines spaced from one another in such group and transverse of the elongated metallic frame member.

4. In an elongated metallic frame member as defined in claim 1 which has a mounting portion extending along at least one longitudinal extremity thereof, and wherein the spacer bar portions in each predetermined group of metal means extend in a direction at right angles to said mounting portion and are positioned parallel to one another in the frame member.

5. In an elongated metallic frame member as defined in claim 1, having a single mounting area in each predetermined group and with said mounting area integral with two oppositely extending individual metal means, and with such two metal means being integral with frame means at the end of each spaced away from the mounting area.

6. In an elongated metallic frame member as defined in claim 1 wherein there are multiple mounting areas in a predetermined group with each one of said mounting areas adapted to have a semiconductor means secured thereon.

7. In an elongated metallic frame member as defined in claim 6 wherein at least two of said mounting areas are each integral with corresponding individual metal means in the predetermined group.

8. In an elongated metallic frame member as defined in claim 6 including one metal portion for said frame member in a predetermined group having the multiple mounting areas thereon, with said metal portion being integral with metal means in said predetermined group.

9. In an elongated metallic frame member as defined in claim 1, wherein there are individual metal means in a predetermined group that are wider in the portion which is inwardly of the spacer bar portions toward the central part of the group than the width of the portion outwardly thereof, such wider portion acting to strengthen such individual metal means at such inward wider portion, and with such wider portion extending out of the ultimate plastic encasing for an integrated circuit device and increasing the strength of such individual means outside of said plastic encasing.

10. In an elongated metallic frame member as defined in claim 1, wherein individual metal means in a predetermined group are disposed within surrounding frame means in a circular pattern, with the mounting area generally centrally within the frame means, and with the spacer bar portions for the predetermined group in a continuous circular configuration surrounding the mounting area and integral with individual metal means in the predetermined group.

11. A one-piece metallic frame member for use in the fabrication of a plurality of headerless plastic encapsulated integrated circuit devices, said metallic frame member including a plurality of individual metal means arranged in predetermined groups, at least one of said individual metal means in each predetermined group having a semiconductor means mounting area thereon positioned generally centrally within said group, with selected individual metal means of a predetermined group each having an end portion adjacent said mounting area adapted for fine-wire connection with said semiconductor means, said selected individual metal means and end portions thereon being divided into two generally oppositely positioned subgroups in a predetermined group, with said end portions of individual metal means in each subgroup lying in a generally straight line so that equipment for bonding fine wires to semiconductor means and to selected individual metal means will move in a generally straight line in a direction transverse to the generally straight line position of the metal-means-end portions in a subgroup, with the semiconductor devices to be fabricated from said metallic frame member being adapted at said mounting area and said end portions to be encased and sealed in plastic by pressure molding, and integral means in said frame member for each predetermined group comprising spacer bar portions between individual means, which said spacer bar portions are positioned within a predetermined group outwardly away from said mounting area in that predetermined group, said spacer bar portions acting to rigidly space apart and stabilize the position of the metal means during fabrication of the integrated circuit devices including the bonding of fine wires therein, said spacer bar portions also acting upon the closed mold around a mold cavity during a plastic molding encasing operation under pressure to limit the spread of plastic flash away from the mounting area and said end portions of metal means within the predetermined group when said mounting area and said end portions lay in a mold cavity for the plastic pressure molding operation.

12. A multiple lead pressure molded plastic encapsulated headerless integrated circuit device having metallic parts which are originally joined together in a one piece metallic frame member during the fabrication of the device, and which were fabricated and were housed at a portion of the deice primarily by automated equipment, said device comprising metallic parts including a plurality of metal means with at least one of said metal means having a mounting area generally centrally of the device, semiconductor means mounted on that area, fine wires which are each bonded at one end to a metal means and at the other end to said semiconductor means and arranged in a plastic housing in a pattern wherein one group of said metal means extends generally in one direction in the plastic housing away from said mounting area and out of the plastic housing at a side thereof, and another group of said metal means extends generally in the opposite direction to said one direction in the plastic housing away from said mounting area and out of the plastic housing, a pressure molded plastic housing completely encapsulating and supporting and sealing in the housing said mounting area and said semiconductor means thereon and said fine wires and the portions of said metal means to which the fine wire connections are made, said metal means being originally a part of an elongated metallic frame member wherein said metal means are arranged in a predetermined group in the frame member and spacer bar portions are integral with metal means in such group, and frame means are provided in said frame member for each said group, with said spacer bar portions maintaining said metal means in position during the fabrication of a device including the plastic encasing under pressure to provide the plastic housing, and said spacer bar portions and frame means being severable after such pressure molded plastic encasing operation, said portions of said metal means which are outside of the plastic housing being arranged in two parallel rows with each row on an opposite side of the plastic housing positioned at right angles to the portions of said metal means within the housing, said plastic housing serving to encapsulate and seal and solely maintain the metallic parts within the housing in fixed positions therein.

13. A multiple lead pressure molded plastic encapsulated headerless integrated circuit device having metallic parts which during the fabrication of the device were originally integral with one another in an elongated metallic frame member with which to fabricate a plurality of such devices, and which metallic parts were fabricated and were housed at a portion of the device primarily by automated equipment, said device comprising metallic parts including a plurality of metal means with at least one of said metal means having a mounting area generally centrally of the device, semiconductor means mounted on that mounting area, fine wires for the semiconductor means which wires are each bonded at one end to a metal means and at the other end to said semiconductor means, said metal means having fine wires bonded thereto being arranged in a generally round pattern in a round pressure molded plastic housing, with such latter metal means each extending with the plastic housing away from said mounting area and out of the plastic housing at the side thereof, and with a portion of each of said metal means outside the plastic housing serving to connect the device into equipment, a pressure molded plastic housing completely encapsulating and supporting and sealing said mounting area and said semiconductor means thereon and said portions of said metal means within the housing together with the fine wire connections between said semiconductor means and the metal means, said metal means being originally a part of an elongated metallic frame member wherein said metal means are arranged in a predetermined group and spacer bar portions are integral with metal means in such group, with said spacer bar portions maintaining said metal means in position during the fabrication of integrated circuit devices and being severable after such pressure molded plastic encapsulation, said metal means which are outside of the plastic housing being positioned in a round pattern and at right angles to the portions thereof within the housing, said plastic housing serving to encapsulate and seal and solely maintain the metallic parts within the housing in fixed positions therein.

14. In a headerless integrated circuit device as defined in claim 13, wherein a portion of each metal means within the housing and extending to the outside of the housing is wider and stronger than the portion of each of said other metal means that is outside the housing and is adapted to connect the device into equipment.

15. An elongated metallic frame member for use in the fabrication of a plurality of individual integrated circuit semiconductor devices, each of which such devices is encased in a plastic housing that is molded under pressure around portions of the device while such portions of such device are still a part of the metallic frame member, with the plastic housing both sealing around and mechanically supporting said portions of a completed device, said metallic frame member including a plurality of metal means arranged in groups with a predetermined number of metal means in each group adapted to be fabricated into an integrated circuit device with each said metal means having two end portions, the inner one of said two end portions extending toward a generally central area in the predetermined group for electrical connection with semiconductor means having electrodes thereon, a bonding area at said inner one of said end portions for receiving a metal connector secured thereto adapted to extend to and be secured to an electrode on semiconductor means for the ultimate device, mounting means positioned in the generally central area in a predetermined group and additional metal means in said metallic frame member supporting said mounting means, with said mounting means adapted to have semiconductor means secured thereto, with the outer one of said two end portions extending in the opposite direction away from said mounting means for ultimate connection to electrical equipment, lead spacer portions in each group extending between and connecting each two adjacent metal means in the group and extending generally at right angles to the portions of such metal means to which said lead spacer portions are connected, said lead spacer portions being integral with said adjacent metal means at a position between said two end portions of each such metal means and acting to rigidly space apart and stabilize the position of said metal means during the fabrication of the semiconductor devices, said lead spacer portions also acting during a plastic molding encasing operation under pressure in a closed mold to limit the spread of plastic flash out of the mold cavity of the closed mold when the inner end portions of the metal means and mounting means of each said group are in position in the mold cavity and are being encased by plastic introduced into the mold cavity under pressure, and each such semiconductor device after such molding operation being severable as a complete plastic encased device from the portions for a predetermined group of the metallic frame member which are in position outside of the mold cavity during the molding operation, such latter portions including the lead spacer portions and the frame portion, with the outer ones of such end portions of the metal means remaining with the device for connection into electric equipment.

16. In an elongated metallic frame member an defined in claim 15 wherein the frame portion for each predetermined group in the metallic frame member surrounds the group, and with the lead spacer portions for the metal means making mechanical integral connections with such metal means therein and with such frame portion.

17. In an elongated metallic frame member as defined in claim 15 wherein the frame portion for each predetermined group surrounds the group, and said mounting means for semiconductor means for a predetermined group extends substantially the dimension of one axis within the frame portion and from one side of the frame portion to the opposite side thereof.

18. In an elongated metallic frame member as defined in claim 15 wherein said mounting means for a predetermined group is adapted to have more than one operating means for the ultimate device supported thereon, and wherein said metal means in a predetermined group are arranged in position in such group so that the bonding area on the inner end portion of each said metal means is in position for the metal connector therefrom to extend therefrom and be secured to an electrode on the operating means for such metal means.

19. In an elongated metallic frame as defined in claim 17, wherein said metal means of a predetermined group are positioned in at least two sub groups and said mounting means is positioned between said sub groups such that the bonding area for each said metal means and an electrode of semiconductor means on said mounting means can be directly connected by a metal connector, and wherein such additional means for said mounting means connects integrally with said surrounding frame portion.

20. An elongated metallic frame member for use in the fabrication of a plurality of individual integrated circuit semiconductor devices, each of which such devices is encased in a plastic housing that is molded under pressure around portions of the device while such portions of such device are still a part of the metallic frame member, with the plastic housing both sealing around and mechanically supporting said portions of a completed device, said metallic frame member including a plurality of metal means arranged in groups of a predetermined number of metal means in each group, a frame portion for each said group providing a surrounding perimeter for the group, lead spacer portions extending in a continuous circular line which is positioned within the frame portion, with said metal means in a group spaced apart from one another and each extending radially from an end portion at a central area of the group outwardly toward the frame portion to an end portion adapted to be ultimately connected to electric equipment, mounting means at said central area for receiving semiconductor means thereon and additional metal means connected to said frame portion and said mounting means maintaining said latter means in position during the fabrication of the semiconductor, with each such metal means being integral with the circularly extending lead spacer portions and such latter portions positioned between the two end portions of each metal means, such lead spacer portions acting not only to maintain such metal means rigidly in position during the fabrication of a semiconductor device but also acting during a plastic molding encasing operation under pressure in a closed mold to limit the spread of plastic flash out of the mold cavity of the closed mold when the inner end portions of the metal means and the mounting means of each group are in position in the mold cavity and are being encased by plastic introduced into the mold cavity under pressure, with each such semiconductor device having the outer end portions of the metal means in a radially spreading pattern, and each such semiconductor device after a molding operation being severable as a complete plastic encased device from the portions for a predetermined group of the metallic frame member which are in position outside of the mold cavity during the molding operation, and such portions for a predetermined group including the lead spacer portions and the surrounding frame portion, with the outer ones of such end portions of the metal means remaining with the device for connection into electric equipment.

21. A multiple lead pressure molded plastic encapsulated headerless integrated circuit device having metallic parts which during the fabrication of the device were originally integral with one another in an elongated metallic frame member with which to fabricate a plurality of such integrated circuit devices, and which metallic parts were fabricated and were plastic encapsulated as a portion of the device primarily by automated equipment, said metallic parts of said device including a plurality of metal means and each said metal means having two end portions, the inner one of said two end portions having a bonding area at the end thereof, a metal connector secured to the metal means at said bonding area, semiconductor means spaced from said bonding area having electrodes thereon and with said metal connector extending from said bonding area and secured to a corresponding electrode on said semiconductor means, mounting means to which said semiconductor means is secured, a pressure molded plastic housing for said device, and with the outer one of said two end portions of a metal means being outside said housing to connect the device to electric equipment, said pressure molded plastic housing completely encapsulating and supporting and sealing therein said inner end portions and the bonding areas of said metal means and said semiconductor means and said metal connectors and said mounting means, said elongated metallic frame member of which said metallic parts were originally integral had a plurality of spaced apart metal means wherein the metal means and the mounting means of said integrated circuit device were arranged in a predetermined group and additional metal means connected said frame member and said mounting means, and said metallic frame member comprised a plurality of such groups, and wherein lead spacer portions extended between and connected each two adjacent metal means in a group and extended generally at right angles to the portions of such metal means to which said lead spacer portions were connected and which said lead spacer portions acted to rigidly space apart and stabilize the position of said metal means during the fabrication of said integrated circuit device, said lead spacer portions also having acted during the plastic molding encapsulating operation under pressure in a closed mold to limit the spread of plastic flash out of the mold cavity of the closed mold in which the plastic encapsulated parts were positioned during the molding operation, with such integrated circuit device having been severable as a complete plastic encapsulated device from portions for a predetermined group of the metallic frame member which had been in position outside of the mold cavity during the pressure molding operation, such portions for a group including lead spacer portions and frame member portions other than the outer one of said two end portions of a metal means which serve to connect said encapsulated device to electric equipment, with said pressure molded plastic housing for said integrated circuit device serving as the mechanical support for the metallic parts within such housing.

UNITED STATES PATENT OFFICE
CERTIFICATE OF CORRECTION

Patent No. 3,611,061 Dated October 5, 1971

Inventor(s) Eugene E. Segerson

It is certified that error appears in the above-identified patent and that said Letters Patent are hereby corrected as shown below:

Column 4, line 69, after "is" insert -- an -- . Column 7, line 74, after "in" insert -- such -- . Column 9, line 51, "deice" should read -- device -- . Column 10, line 27, change "with" to read -- within -- .

Signed and sealed this 20th day of March 1973.

(SEAL)
Attest:

EDWARD M.FLETCHER,JR.
Attesting Officer

ROBERT GOTTSCHALK
Commissioner of Patents